United States Patent
Huang et al.

(10) Patent No.: US 6,177,719 B1
(45) Date of Patent: Jan. 23, 2001

(54) CHIP SCALE PACKAGE OF SEMICONDUCTOR

(76) Inventors: Chih-Kung Huang; Shu-Hua Tseng, both of 6-20 Ta-Po Road, Chiao-Pai Li, Yi-Lan (TW)

(*) Notice: Under 35 U.S.C. 154(b), the term of this patent shall be extended for 0 days.

(21) Appl. No.: 09/478,860

(22) Filed: Jan. 7, 2000

(30) Foreign Application Priority Data

Mar. 31, 1999 (TW) .............................................. 088105092

(51) Int. Cl.$^7$ ................................................. H01L 23/495

(52) U.S. Cl. ........................................... 257/666; 438/123
(58) Field of Search ................................... 438/119, 106, 438/111, 115, 123, 124; 257/686, 666, 676, 736, 766, 698, 668, 778, 667, 669, 671

(56) References Cited

U.S. PATENT DOCUMENTS 5,352,926 * 10/1994 Andrews .............................. 257/717

* cited by examiner

Primary Examiner—Matthew Smith
Assistant Examiner—Calvin Lee
(74) Attorney, Agent, or Firm—Jiawei Huang; J C Patents (57) ABSTRACT

A chip scale package, which can be fabricated on a print circuit board, comprises a chip having multiple electrodes, a plurality of conductive blocks, and an insulating material. The electrodes of the chip are electrically connected to the conductive blocks respectively through one of the surfaces thereof by a conductive bond, and are electrically connected to the circuit on the print circuit board through the side surfaces thereof. The insulated material is filled on the chip surface between the conductive blocks, and in the gap between the conductive blocks and the chip.

14 Claims, 7 Drawing Sheets

CHIP SCALE PACKAGE OF SEMICONDUCTOR

CROSS-REFERENCE TO RELATED APPLICATION

This application claims the priority benefit of Taiwan application serial no. 88105092, filed Mar. 31, 1999.

BACKGROUND OF THE INVENTION

1. Field of the Invention

This invention relates to a chip scale package (CSP), and more particularly to a chip scale package of semiconductor.

2. Description of Related Art

Following the development of the semiconductor industry, a lot of related new technology is continuously progressing and changing. The manufacturing process of a semiconductor product is generally divided into three stages, firstly the formation of semiconductor base, i.e. the portion of chip-forming technology; secondly, the manufacturing of semiconductor devices such as Metal Oxide Semiconductor (MOS.), the conductive wire inter-connection of stacked metal etc., lastly the packaging process. Today, almost all the efforts on the development of electronic products are heading for the target of light, thin, short. and small in dimension. For examples, these efforts are to raise the degree of intoglation for the semiconductor, and to provide various types of packaging technology such as Chip Scale Package (CSP), Multi-Chip Module (MCM) etc. As the manufacturing technology of semiconductor has progressed to such a tiny width as 0.18 $\mu$m of semiconductor elements, the degree of integration has become a great break through. Therefore, how to develop the corresponding tiny packages of semiconductor to achieve the object of minimizing the semiconductor products has become the important topic of study nowadays.

Figure 1:
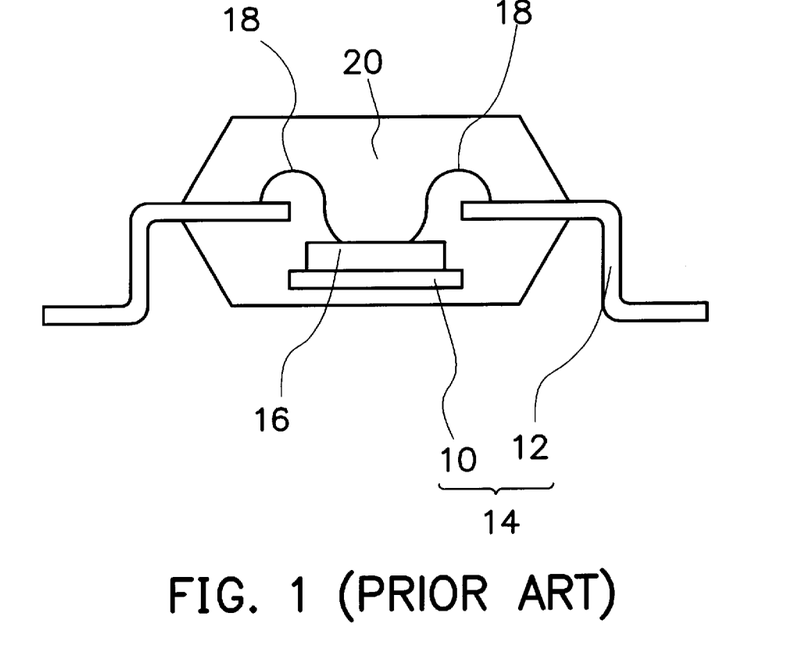
FIG. 1 is a schematic cross-sectional view of a semiconductor package with low-number-of-lead according to the prior art.

As far as the semiconductor devices of low-number-of-lead are concerned, for examples, high voltage transistor device and identification microchip etc., generally, lead frame is still employed as a chip carrier. Shown in FIG. 1 is a schematic cross-sectional view of the semiconductor package of low-number-of-lead according to the prior art. Take a high voltage transistor device on the circuit board for example, the conventional high voltage transistor device is used for being functioned as a switch. This high voltage transistor device is a Metal-Oxide-Semiconductor Field Effect Transistor (MOSFET) having three connecting points, a gate, a source, and a drain.

As shown in FIG. 1, the conventional chip scale package is a Small Outline Transistor (SOT) type with its lead frame possessing four leads 12 and a chip carrier 10. After the chip 16 is bonded to the chip carrier 10, by the use of wire bonding method, bond wire 18 is employed to connect the gate, source, and drain of the chip 16 to the lead 12. Thereafter, a insulated material 20 is employed to encapsulate the chip 16, the chip carrier 10, the bond wire 18, and the inner end of the lead 12. The outer end of the lead 12 is to be formed as a Z-shaped lead (also called as a Gull-Wing type) to facilitate the follow-up SMT (Surface Mount Technique) fabrication.

The conventional chip scale package of the SOT type as described above is quite possible to increase the circuit impedance. Consequently, it will result in signal decay and signal delay since the input/output of the signal is unable to transmit to the chip 10 without passing through the path including the lead and the wire which is relatively lengthy.

As far as the mass production type of semiconductor technology of today is concerned, for the MOSELT with 0.4 $\mu$m of lead width, the resistance as low as 0.2 mini-ohm-cm has been achieved. However, the resistance of the lead of the conventional chip scale package is as high as 20 mini-ohm-cm that is totally unmatched to the chip, and thereby seriously affecting the performance of the device. In additions, this type of packaging makes the volume of the device increase, the area of application is therefore limited, besides, it contradicts the design principle of light, thin, short, and small in dimension.

SUMMARY OF THE INVENTION

It is the first objective of the present invention to provide a chip scale package of semiconductor to shorten the signal-transmitting path in order to raise the chip performance.

It is the second objective of the present invention to provide a chip scale package of semiconductor to make use of the method of the "chip scale package" in order to diminish the volume of the package.

It is the third objective of the present invention to provide a chip scale package of semiconductor to simplify packaging process and to lower the cost of packaging.

It is the fourth objective of the present invention to provide a chip scale package of semiconductor to improve the thermal dissipation problem.

In order to attain the foregoing and other objectives, the present invention provides a ball grid array package that can be fabricated on a print circuit board. The chip scale package of semiconductor of the present invention comprises a chip having multiple electrodes, a plurality of conductive blocks, and an insulating material. The electrodes of the chip are electrically connected to the conductive blocks respectively through one of the surfaces thereof by a conductive bond, and are electrically connected to the circuit on the print circuit board through the side surfaces thereof. The insulated material is filled on the chip surface between the conductive blocks, and in the gap between the conductive blocks and the chip.

According to a preferred embodiment of the present invention, the foregoing electrodes can be disposed on either one surface or on both of the two surfaces. In additions, the bonding surface between the conductive block and the print circuit board preferably includes a plated layer to strengthen the bonding capability between them.

Moreover, in order to attain the foregoing and other objectives, a fabricating process of a chip scale package of semiconductor firstly provides a chip, having a first surface and a second surface. The first surface of the chip has a set-up of a gate and a first source/drain region, while the second surface of the chip has a set-up of a second source/drain region. Secondly, it provides a first conductive plate which is disposed on the first surface of the chip. T further comprises a substrate on which a first bump and a second bump are disposed on the same side. In this way, the first conductive plate can make the first bump and the gate as well as the second bump and the first source/drain region electrically couple respectively by using a conductive bond. Meanwhile, it provides a second conductive plate which is disposed on the second surface of the chip and is electrically coupled with the second source/drain region by a conductive bond. Thereafter, it fills an insulating material between the chip and the substrate as well as between the chip and the second conductive plate. Then, it removes the first conductive plate to expose a portion of the insulated substance which is disposed on the area excluding that covered by the first bump and the second bump on the first surface. Finally, it performs a sawing process to expose at least a side surface of the first bump, the second bump, the second conductive plate, and the chip to accomplish the foregoing chip scale package.

According to a preferred embodiment of the present invention, the foregoing process to remove a portion of the first conductive plate includes etching or sawing. The material of the conductive bond includes anisotropic conductive paste, anisotropic conductive film, solder film, conductive bump, or silver epoxy.

Since the electrodes of the chip depend only on the connection between the conductive block and print circuit board, and since the thickness of the conductive block of the present invention is only around 2–20 Mil ($2-20\times10^{-3}$ inches), thereby, the signal transmitting path is significantly shorten. Consequently, the resistance can be lowered, and the problem of signal delay can be improved.

As the conductive block is sawed together with the chip, its area will be the same as that of the chip, and because the conductive block is rather thin in thickness, thereby, the overall packaging volume can be significantly reduced. Moreover, since the structure of the present invention directly bonds the conductive plate to the electrodes of the chip by the use of conductive bond, the fabricating process can be simplified and the cost can be lowered. Besides, as the chip becomes naked after being sawed, the thermal dissipation effect of the package can be improved.

BRIEF DESCRIPTION OF DRAWINGS

The objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

The wafer level package of a semiconductor of the present invention including high voltage transistor devices, identification microchip etc. is for devices having low number of leads and generally having only a few input/output connecting points. The fact that only a high voltage transistor device is used as a preferred embodiment is not to be used as a limitation to the range of application of the present invention.

Figure 2:
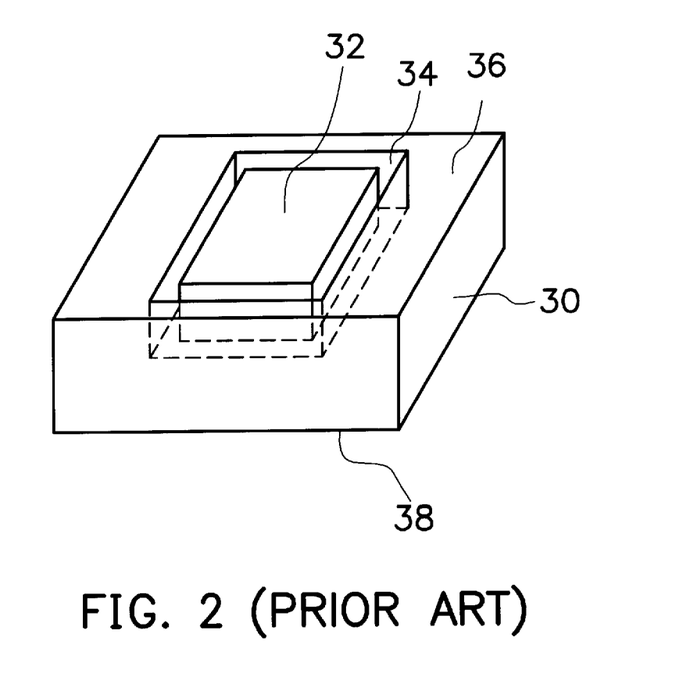
FIG. 2 is an isometric view of a high voltage transistor device according to the prior art.

Shown in FIG. 2 is a isometric view of a high voltage transistor device according to the prior art. The conventional high voltage transistor device being constituted by a metal oxide semiconductor field effect transistor (MOSFET) is constructed on a silicon substrate 30. The metal oxide semiconductor field effect transistor comprises a gate 32, an insulating material 34 surrounding the periphery of gate 32, a source 36 positioned at the periphery of the insulating material 34, and a drain 38 positioned on the back of the silicon substrate 30. In general, the gate 32 is a stacked multiple layers of material. For example, the bonding portion of the gate 32 bonded to the silicon substrate 30 possesses an insulating layer having conducting layers such as Titanium, Nickel, and silver etc. stacked up thereon. The insulating material 34 can be a phosphorus-silicon glass (PSG), and the source 36 is constructed by stacking up Titanium, Titanium nitride, and Aluminum-Silicon-Copper alloy while the drain 38 is stacked up by conductive layer such as Titanium, Nickel, and Silver etc.

Figure 3A:
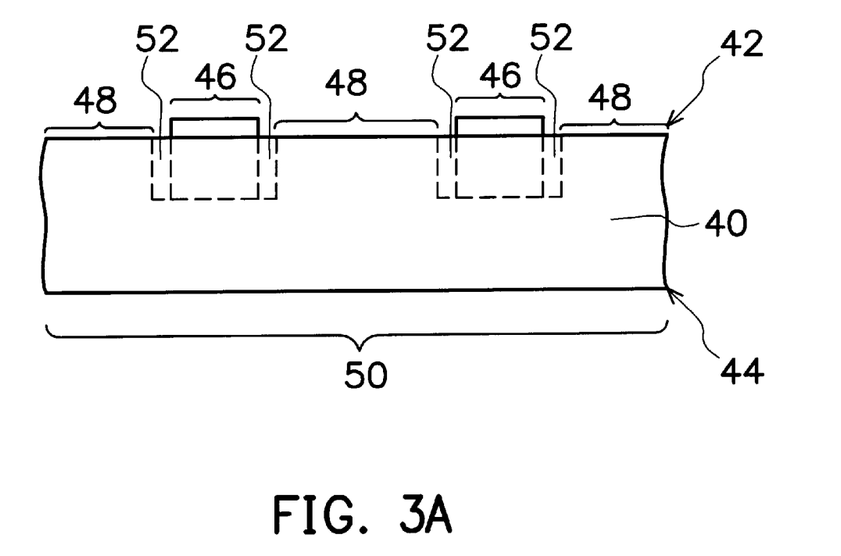
FIG 3A to FIG. 3F are schematic cross-sectional views of the fabricating process of the chip scale package of a preferred embodiment according to the present invention.

Shown in FIG. 3A to FIG. 3F are schematic cross-sectional views of the fabricating process of the chip scale package of a preferred embodiment according to the present invention. Firstly, as shown in FIG. 3A, a MOS transistor is formed on a chip 40, which is made of silicon, by performing a semiconductor process. The transistor comprises a gate 46 and a source/drain region 48 positioned on the first surface 42 of the chip 40, and another source/drain region 50 positioned on the second surface 44 of the chip 40. The insulating material 52 is used as an isolating structure between gate 46 and source/drain region 48.

Figure 3B:
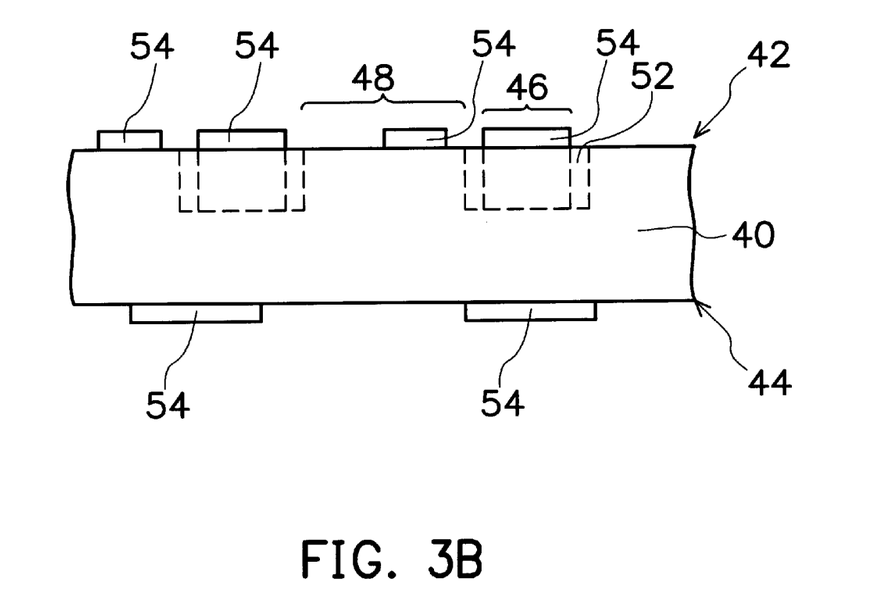

Subsequently, as shown in FIG. 3B, a conductive bond 54 is formed at the electrodes (including gate 46, and source/drain region 48, 50) on the chip 40 wherein the material of the conductive bond 54 can be a Silver Epoxy or a solder film (e.g. Tin-Lead Alloy) with 1–2 Mil ($1-2\times10^{-3}$ inch. ) of thickness. If an Anisotropic Conductive Paste or an Anisotropic Conductive Film is substituted for the Silver Epoxy material of the conductive bond 54, the conductive bond 54 can then be formed on both the first surface 42 and the second surface 44 on the whole chip 40. Certainly, a conductive bump such as a solder bump, a conductive epoxy bump, or a gold bump can also be formed the electrodes of the chip 40.

Figure 3C:
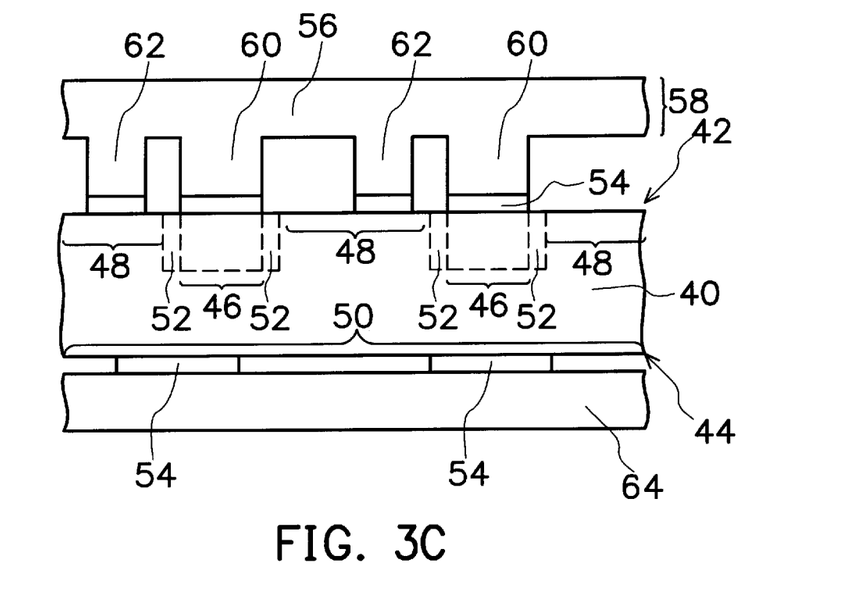
Figure 6A:
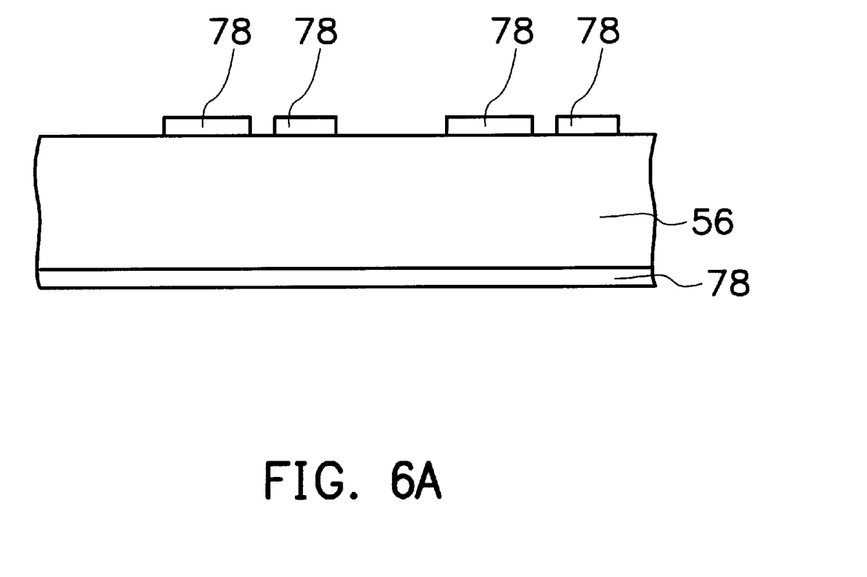
FIG. 6A and FIG. 6B are cross-sectional views of a process having the bump-shaped conductive plate according to the present invention.
Figure 6B:
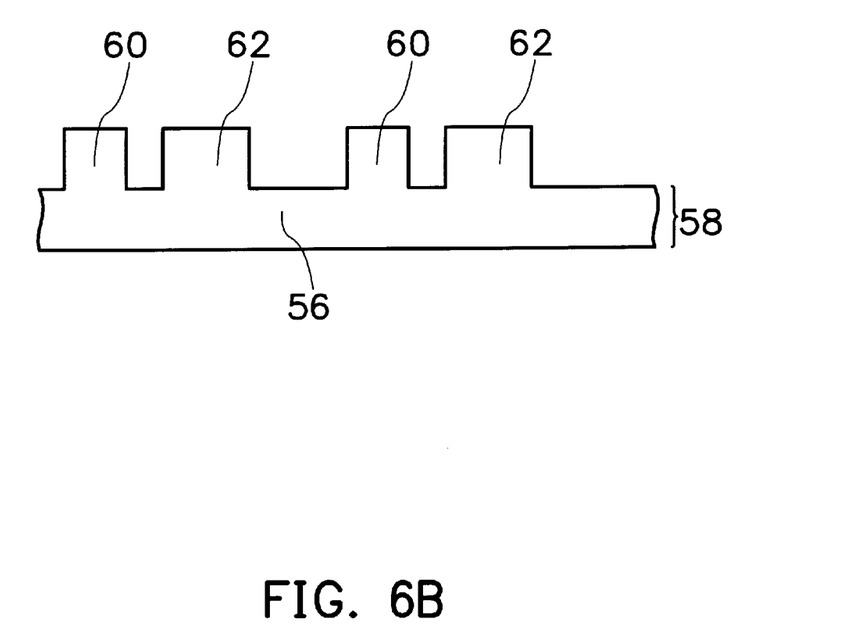

FIG. 3C illustrates a process to dispose a conductive plate 56 on the first surface 42, and another conductive plate 64 on the second surface 44 of the chip 40. The conductive plate 56 (the preparation of the conductive plate 56 as shown in FIG. 6A and 6B will be illustrated later) comprises a substrate 58, a bump 60, and a bump 62. The bump 60 is disposed at a location corresponding to the gate 46 of the chip 40 while the bump 62 is disposed at a location corresponding to the source/drain region 48 of the chip 40. The bump 60 and the bump 62, both making use of the conductive bond 54, are connected to the gate 46 and source/drain region 48 respectively while the conductive bond 54, also making use of the conductive bond 54, is electrically coupled with the source/drain region 50. The main purpose of setting up the bump 60, 62, and the conductive bond 54 is for the gate 46 and the source/drain region 48, 50 of the chip 40 to form connecting points. Therefore, there is no limitation on their shapes and the extent of their ranges, however, their resistance values should be taken into consideration. In the present embodiment, the preferred thickness of the conductive plate 56 is around 10–20 Mil. wherein the thickness of the substrate 58 is around 3–7 Mil while the preferred thickness of the conductive plate 64 is 3–7 Mil., and the material of the conductive plate 56, 64 can be a copper, for example. As compare with the conventional techniques of wire bonding and Tape Automatic Bonding (TAB), this process of forming connection needs only simple alignment and compression, thereby, the cost can significantly be reduced.

Figure 3D:
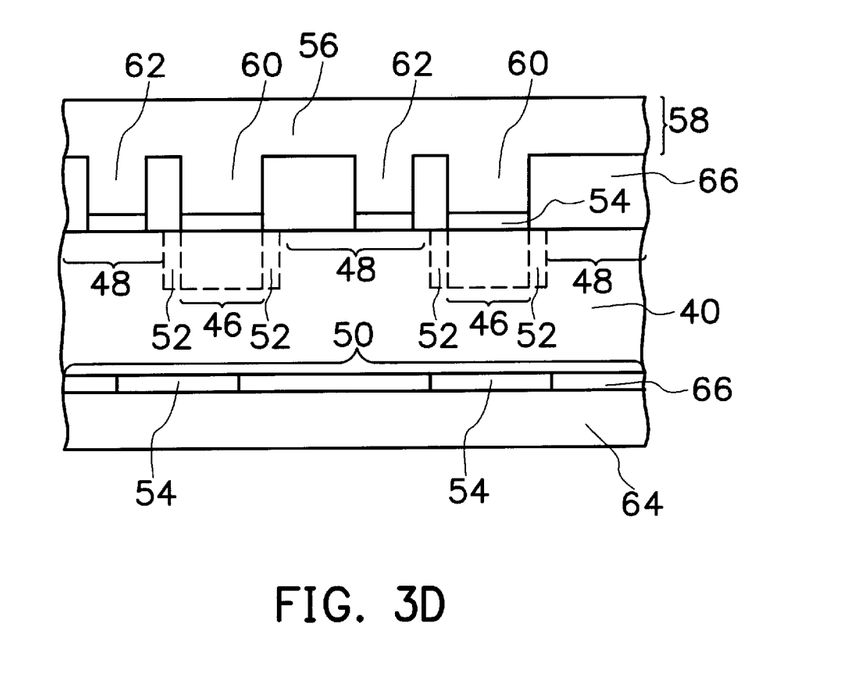

FIG. 3D illustrates the subsequent molding process. An insulating substance 66 is used to fill between the chip 40 and substrate 58, as well as between the chip 40 and the conductive plate 64 wherein the material of the insulating substance 66 can be a liquid compound for example. The capillary phenomenon can be employed to fill the gap between the conductive plate 60 and the chip 40, as well as between the substrate 58 and the chip 40. Another way is to form multiple holes on the substrate 58 and the conductive plate 56, then to fill the gap by employing the methods of injection or dispense or glob top. However, a common molding compound can be used as insulating substance 66 if the injection method is employed.

Figure 3E:
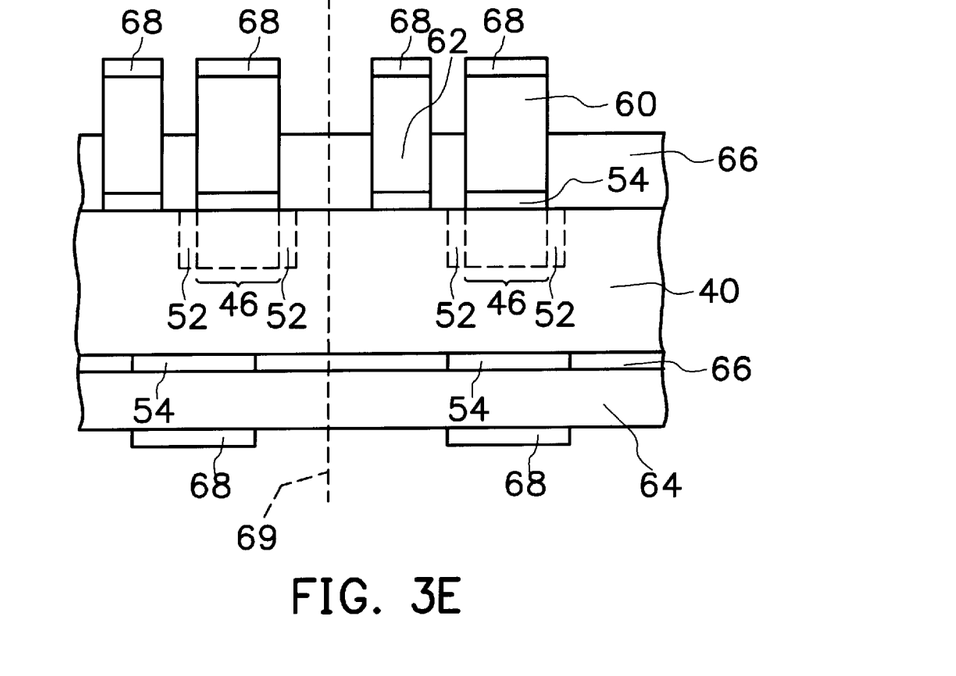

FIG. 3E illustrates the peeling process. The substrate 58 (shown in FIG. 3D) part of a portion of the conductive plate 56 (shown in FIG. 3D) is removed to make the bump 60 and bump 62 separate and to expose the insulating substance 66 between the bump 60 and bump 62. The way to remove a portion of the conductive plate 56 includes the methods of etching or sawing. However, in order to improve the bonding ability of the subsequent surface soldering process, before the stripping process is performed, plated layers 68 can be formed at the locations corresponding to the bump 60, 62 on the surface of the substrate 58, the side surfaces (not shown) of the bump 60, 62, as well as at the locations corresponding to the surface and side surface(not shown) of the bonding area of the chip 40. The material of the plated layer 68 can be constructed by a laminated layer of metal, for example, Copper, Silver, Gold, Nickel, Palladium, Nickel-Palladium alloy, or the combination of those.

Figure 3F:
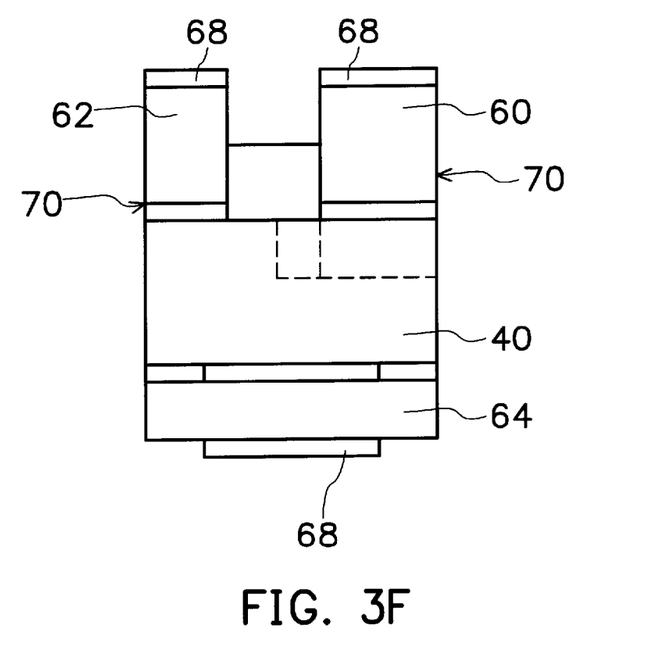

FIG. 3F illustrates that a sawing process is performed along the scribed line 69 of the structure shown in FIG. 3E. After the sawing, the MOS transistor device is separated to become an independent semiconductor chip scale package, thereby, not only the bump 60, 62 and the conductive plate 64 expose their side surfaces 70 but also become independent conductive blocks respectively.

Figure 4A:
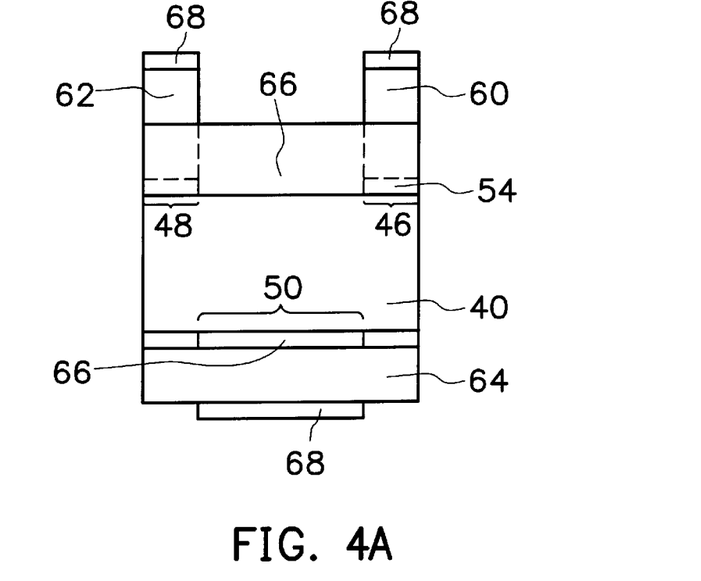
FIG. 4A and FIG. 4B are the top view and a side view respectively of a chip scale package of a semiconductor of a preferred embodiment according to the present invention.
Figure 4B:
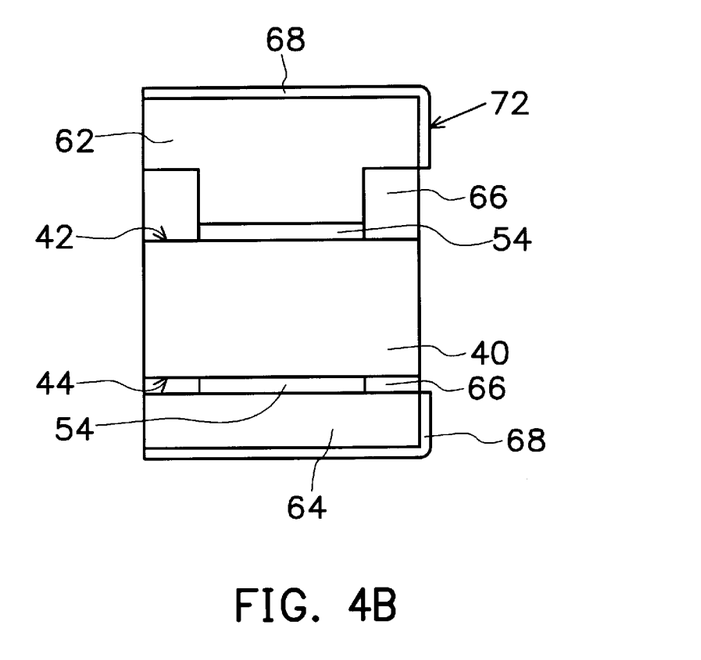

4A is the top view of a semiconductor chip scale package of a preferred embodiment according to the present invention, and FIG. 4B is a left side view of FIG. 4A. Basically, the semiconductor chip scale package of the present invention comprises a chip 40, conductive block 60 ( bump), 62 (bump), 64(conductive plate), and insulation substance 66. The conductive block 60, 62, 64 are disposed at the locations corresponding to the electrodes 46 (gate), 48/50 (source/drain) on both of the two surfaces of the chip 40, and are electrically coupled through the conductive bond 54. Also, the insulation substance 66 is filled between the chip 40 and the conductive block 60, 62 as well as between the chip 40 and the conductive block 64. It is worth while to mention that the semiconductor chip scale package of the present invention is connected out through the side surfaces 72 of the conductive block 60, 62, 64, thereby, to form a plated layer 68 on the surface and side surface of the conductive block 60, 62, 64 is a preferred way in order to improve soldering ability the subsequent soldering process.

Figure 5:
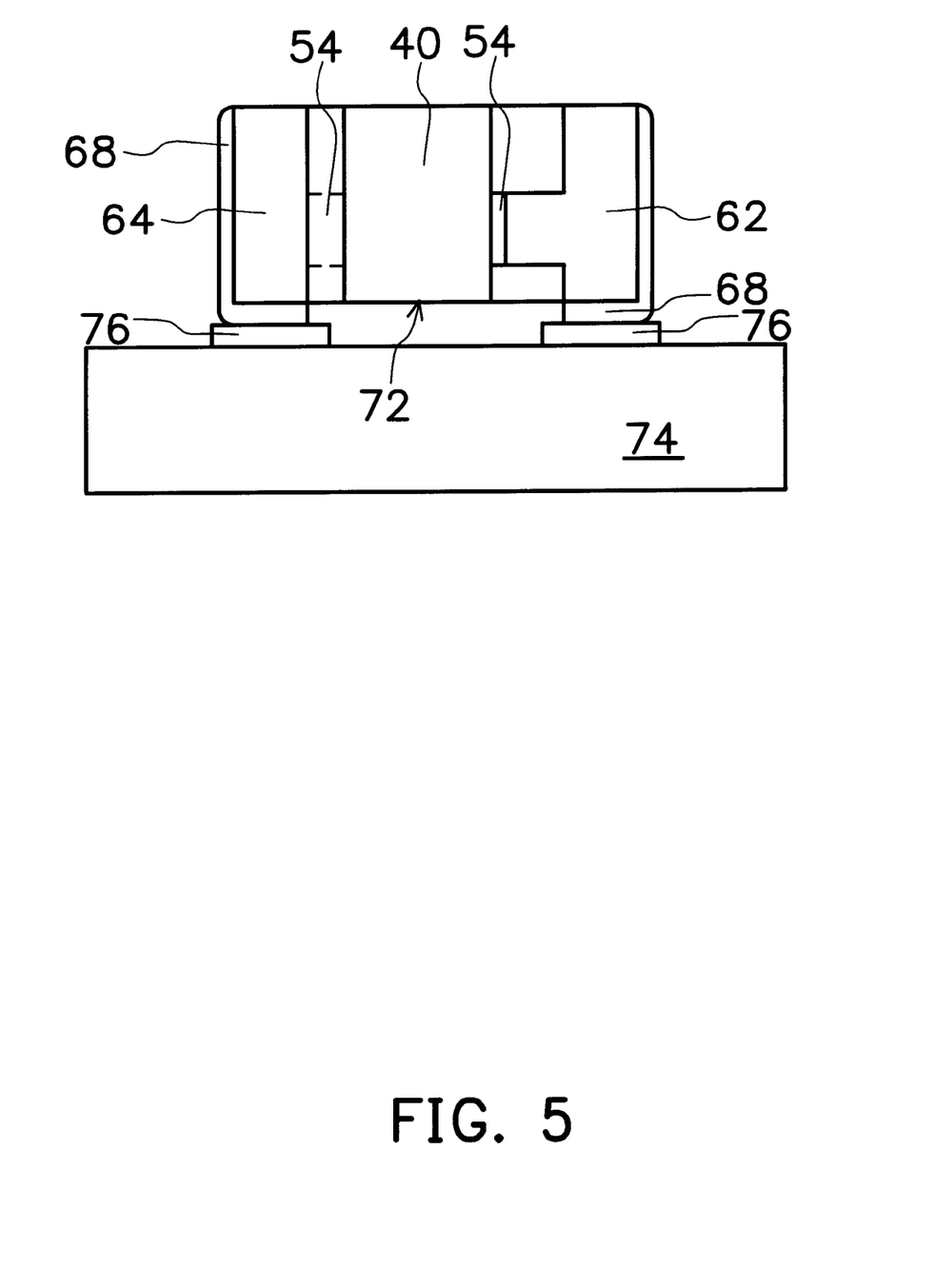
FIG. 5 is a schematic view of a chip scale package of a semiconductor of a preferred embodiment applied in a print circuit board according to the present invention.

FIG. 5 is a schematic view of a chip scale package of a semiconductor of a preferred embodiment applied in a print circuit board according to the present invention. The semiconductor chip scale package of the present invention is to make use of the side surfaces 72 of the conductive block 60, 62, 64 to connect to the connecting point of the print circuit board 74 by the use of a kind of bonding method, for example, the surface mount technology (SMT). Since the side surfaces 72 of the conductive block 60, 62, 64 have a plated layer 68, the soldering effect can be improved. In additions, the structure of the semiconductor chip scale package of the present invention exposes the naked side surfaces 72 of the chip 40, thereby, the heat-dissipating effect of the package can be greatly improved.

As for the conductive plate 56, the fabricating method of the one similar to the lead frame can be employed. FIG. 6A and FIG. 6B are cross-sectional views of a process having the bump-shaped conductive plate according to the present invention. A photo-resist layer 78 can be coated first on the conductive plate 56 wherein one of the surfaces of the conductive plate 56 is coated for the full surface while the other surface is coated only on those areas where the bumps are intended to form. Next, as shown in FIG. 6B, by the use of the photo-resist layer ( 78 as shown in FIG. 6A) to be a mask to strip off a portion of the conductive plate 56 in order to form bump 60, 62 and substrate 58, thereafter, to strip off all the photo-resist layer 78 (as shown in FIG. 6A).

To summarize the foregoing illustration disclosed by preferred embodiments of the present invention, the semiconductor chip scale package of the present invention comprise the following advantages:

1. The semiconductor chip scale package of the present invention can shorten the path of signal transmission to improve the chip performance. This is because that a surfaces of the conductive block is employed to connected to the electrodes of the chip, and the side surface of the conductive block is also used to connect to the print circuit board.
2. The semiconductor chip scale package of the present invention can significantly reduce the volume of the package. This is because that the semiconductor chip scale package of the present invention employs the structure of chip level package.
3. The semiconductor chip scale package of the present invention can simplify the fabrication process of the package and lower the cost of the packaging process. This is because that the conductive plate needs only a simple alignment and compression in order to connect to the electrodes of the chip, and the preparation of the conductive plate can employs the process similar to that of the lead frame which is simple in structure and process.
4. The semiconductor chip scale package of the present invention can significantly improve the heat-dissipating problem. T his is because that the side surface of the chip can be exposed to become naked.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A fabricating process of a chip scale package of semiconductor comprising:

providing a chip, having a first surface and a second surface wherein the first surface of the chip has a set-up of a gate and a first source/drain region while the second surface of the chip has a set-up of a second source/drain region;

providing a first conductive plate, disposed on the first surface of the chip wherein the first conductive plate further comprises a substrate on which a first bump and a second bump are disposed on the same side to make the first bump and the gate as well as the second bump and the first source/drain region electrically couple respectively by using a conductive bond;

providing a second conductive plate, disposed on the second surface of the chip and is electrically coupled with the second source/drain region by a conductive bond;

filling an insulating material between the chip and the substrate as well as between the chip and the second conductive plate;

removing the first conductive plate to expose a portion of the insulating material disposed on the area excluding that covered by the first bump and the second bump on the first surface; and performing a scribing process to expose at least a side surface of the first bump, the second bump, the second conductive plate, and the chip to form the chip scale package.

2. The fabricating process of a chip scale package of semiconductor of claim 1 wherein the material of the first conductive plate, and the second conductive plate, further comprise copper.

3. The fabricating process of a chip scale package of semiconductor of claim 1 wherein the forming process of the first conductive plate comprises:

providing a flake-shaped copper material;

coating a photo-resist layer on both sides of the flake-shaped copper material;

providing a second conductive plate, disposed on the second surface of the chip and electrically coupled with the second source/drain region by a conductive bond;

filling an insulating material between the chip and the substrate as well as between the chip and the second conductive plate;

performing a exposure and development process on one side of flake-shaped copper material of the photo-resist layer to make it cover only the first bump and second bump regions;

etching a portion of the flake-shaped copper material, by the use of the photo-resist layer as a etching mask, to form the first bump and the second bump; and removing the photo-resist layer to form the first conductive plate.

4. The fabricating process of a chip scale package of semiconductor of claim 1 wherein electrically coupling method of the first bump and the gate, the second bump and first source/drain region, as well as the second conductive plate and the second source/drain region are connected by a conductive bond respectively.

5. The fabricating process of a chip scale package of semiconductor of claim 4 wherein the conductive bond further comprises a silver epoxy.

6. The fabricating process of a chip scale package of semiconductor of claim 4 wherein the conductive bond further comprises an anisotropic conductive paste.

7. The fabricating process of a chip scale package of semiconductor of claim 4 wherein the conductive bond further comprises an anisotropic conductive film.

8. The fabricating process of a chip scale package of semiconductor of claim 4 wherein the conductive bond further comprises a solder film.

9. The fabricating process of a chip scale package of semiconductor of claim 4 wherein the conductive bond further comprises a conductive bump.

10. The fabricating process of a chip scale package of semiconductor of claim 1 wherein the insulated material further comprises a liquid compound.

11. The fabricating process of a chip scale package of semiconductor of claim 1 wherein a process before the process of removing a portion of the first conductive plate further comprises plating a plated layer on the surface of the substrate and its side surface in the area corresponding to the first bump and second bump, as well as a portion of the surface and its side surface of the second conducting plate.

12. The fabricating process of a chip scale package of semiconductor of claim 11 wherein the material of the plating layer is selected from one of the material group which comprises Copper, Nickel, Silver, Gold, Palladium, Nickel-Palladium alloy, and the combination of those.

13. The fabricating process of a chip scale package of semiconductor of claim 11 wherein the method of removing a portion of the first conductive plate includes etching.

14. The fabricating process of a chip scale package of semiconductor of claim 11 wherein the method of removing a portion of the first conductive plate includes sawing.

* * * * *